(12) United States Patent
Yoshihara et al.

(10) Patent No.: US 7,944,042 B2
(45) Date of Patent: May 17, 2011

(54) SEMICONDUCTOR DEVICE AND METHOD OF MANUFACTURING SAME

(75) Inventors: Katsuhiko Yoshihara, Matsumoto (JP);
Rikihiro Maruyama, Matsumoto (JP);
Masaaki Chino, Nagano (JP); Eiji Mochizuki, Matsumoto (JP); Motokiyo Yokoyama, Azumino (JP); Tatsuo Nishizawa, Tokyo (JP); Tomonobu Sugiyama, Tokyo (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 535 days.

(21) Appl. No.: 12/068,786

(22) Filed: Feb. 12, 2008

(65) Prior Publication Data
US 2008/0217760 A1 Sep. 11, 2008

(30) Foreign Application Priority Data

Mar. 8, 2007 (JP) ................................. 2007-058030
Jun. 6, 2007 (JP) ................................. 2007-150426

(51) Int. Cl.
*H01L 23/48* (2006.01)

(52) U.S. Cl. ........ 257/693; 257/726; 257/723; 257/712; 257/717; 257/690; 257/691; 257/787; 257/728; 257/719; 257/713; 257/E23.01

(58) Field of Classification Search .................. 257/726, 257/723, 712, 717, 691, 690, 787, 728, 719, 257/687, 693, 713, E23.01
See application file for complete search history.

(56) References Cited

U.S. PATENT DOCUMENTS

| | | | |
|---|---|---|---|
| 5,920,119 A * | 7/1999 | Tamba et al. ................. | 257/718 |
| 6,421,244 B1 * | 7/2002 | Shinohara et al. ............ | 361/736 |
| 6,995,461 B2 | 2/2006 | Soyano et al. | |
| 7,445,519 B2 | 11/2008 | Matsumoto | |
| 7,541,670 B2 | 6/2009 | Matsumoto | |
| 2008/0142948 A1 | 6/2008 | Matsumoto | |

FOREIGN PATENT DOCUMENTS

| | | |
|---|---|---|
| JP | H11-168168 | 6/1999 |
| JP | 2004-022811 | 1/2004 |

* cited by examiner

*Primary Examiner* — Cuong Q Nguyen
*Assistant Examiner* — Trang Q Tran
(74) *Attorney, Agent, or Firm* — Manabu Kanesaka

(57) ABSTRACT

A semiconductor device includes an outer resin case having a peripheral wall and terminal mounting holes formed in the peripheral wall, and a layer assembly provided in the outer resin case. The layer assembly includes a semiconductor chip, an insulating circuit board on which the semiconductor chip is mounted, and a heat-dissipating metal base. External terminals having leg portions are arranged in mounting holes of the peripheral wall, and are press-fitted into the terminal-mounting holes. Bonding wires connect the terminal leg portions and a conductive pattern of the insulating circuit board or the semiconductor chip.

10 Claims, 8 Drawing Sheets

SEMICONDUCTOR DEVICE AND METHOD OF MANUFACTURING SAME

BACKGROUND OF THE INVENTION AND RELATED ART STATEMENT

This invention relates to a semiconductor device applied in intelligent power modules (IPMs) used in inverter devices, and more specifically relates to the package structure, and the method of assembly of semiconductor devices.

FIG. 11 through FIGS. 13A, 13B show an assembled structure of the semiconductor device packages of the prior art. In FIG. 11, numeral 1 is a heat-dissipating metal base formed from copper; numeral 2 is an insulating circuit board with a conductor pattern formed on both faces of an insulating board; numeral 3 is a semiconductor chip (for example, an IGBT (Insulated Gate Bipolar Transistor)) mounted on the insulating circuit board 2; numeral 4 is solder joining layer, which joins the metal base 1 and insulating circuit board 2, and the insulating circuit board 2 and semiconductor chip 3; numeral 5 is an outer resin case; numeral 6 is an external terminal provided in a row in a wall portion of the outer resin case 5 (main terminals, control terminals); numeral 7 is a bonding wire (aluminum wire) connecting the L-shape leg portion 6a protruding from the external terminal 6 on the inside of the outer resin case 5 and the conductor pattern of the insulating circuit board 2; numeral 8 is a case lid; and numeral 9 is a sealing resin which fills the inside of the outer resin case 5, wherein the outer terminals 6 are formed integrally with the outer resin case 5 in insert molding of the wall portion thereof (see for example Japanese Unexamined Patent Publication No. 2003-249624, corresponding to U.S. Pat. No. 6,995,461). Separately from the wiring shown in FIG. 11, there are cases in which direct bonding wire 7 is used to connect the upper-face main electrodes of the semiconductor chip 3 and the external terminals 6.

A semiconductor device configured as above is assembled using the following procedure. First, the copper material is subjected to rolling, punching, and bending to fabricate the external terminals 6, which are set in prescribed positions within a mold used to form an outer resin case 5. Next, an injection resin such as PPS (polyphenylene sulfide), PBT (polybutylene terephthalate), or similar material is injected into the forming mold, and with the external terminals 6 integrated by insert molding, the outer resin case 5 is fabricated.

On the other hand, in the package assembly process, a board assembly in which the insulating circuit board 2 and semiconductor chip 3 are mounted on the metal base 1 is placed on the bottom face of the outer resin case 5, and the periphery of the metal base 1 is bonded to the outer resin case 5 with an adhesive (for example a silicone adhesive).

In the wiring process, subsequently, bonding wires 7 are connected between the L-shape leg portions 6a of the external terminals 6 drawn inside from the outer resin case 5 and the conducting pattern of the insulating circuit board 2. In this wiring process, an ultrasonic bonding method is used to connect the wires 7. After wiring of the wires 7, the resin case 5 is filled with a sealing resin 9, and the case lid 8 is fitted into place to complete the product.

After delivery of this semiconductor product to a customer, the product is for example mounted in an inverter device and the external terminals 6 are connected to a print board of the inverter device, for use in applications such as IPM (Intelligent Power Module) motor control.

In the above-described semiconductor device of the prior art, the package is configured with the external terminals 6. The external terminals 6 are insert-molded with the wall portion of the outer resin case 5 for each apparatus, positioned and arranged according to the current capacity of the semiconductor chip 3, position of placement, the details of the print board of the inverter device or other equipment, and other specifications. An example of such an arrangement of terminals appears in FIG. 12. FIGS. 13A and 13B are external diagrams of external terminals 6 used according to the magnitude of the current to be passed.

However, in the package assembly structure of FIG. 11 and FIG. 12, the placement positions and shapes of the external terminals 6 differ depending on the device model and on the specifications of custom products specified by a customer. For this reason, when a manufacturer manufactures a product, a forming mold for the outer resin case 5, designed according to the device model and to specifications specified for each custom product by a customer, must be newly fabricated and managed. Moreover, because it is in actuality difficult for an assembly robot to automatically set external terminals 6 with different shapes (see FIGS. 13A and 13B) in specified positions within the forming mold according to the product specifications, human labor is necessary to perform this task. As a result there is a long period from receipt of an order for a custom product to the delivery of the product, and moreover production costs are high.

This invention has been made in light of the above perspectives. An object of the invention is to resolve the above problems in providing a semiconductor device and a method of manufacture of a semiconductor device with an improved package assembly structure enabling manufacture of products in which the arrangement of external terminals mounted in the case can be made flexibly with different device models and various customer-specified specifications, with the outer resin case as a common component.

Further objects and advantages of the invention will be apparent from the following description of the invention.

SUMMARY OF THE INVENTION

In order to attain the above object, a semiconductor device of this invention combines an outer resin case with a layer assembly of a semiconductor chip, an insulating circuit board on which the semiconductor chip is mounted, and a heat-dissipating metal base having leg portions (L-shaped leg portions) of external terminals arranged in the wall of the outer resin case drawn to the inside of the case, and bonding wires connecting the terminal leg portions to the conductive pattern of the insulating circuit board or the semiconductor chip.

According to the first aspect of the invention, assembly is performed by pushing the external terminals into terminal-mounting holes formed in advance in the peripheral wall of the outer resin case. More specifically, it is configured as described below.

(1) With the outer resin case as a common component used in various device models, in order to flexibly accommodate the placement positions of external terminals mounted in this case and customer-specified specifications, terminal mounting holes apportioned and formed in the peripheral wall of the outer resin case are formed so as to conform to all different terminal arrangements for all models and specifications (the second aspect of the invention).

(2) Further, in order to increase the distance along the peripheral wall from the peripheral wall of the outer resin case to the external terminals drawn upward, depression-protrusion shape step portions are formed in the upper face of the peripheral wall of the outer resin case, corresponding to the pitch at which terminal mounting holes are arranged (the third aspect of the invention).

(3) On the other hand, in order to firmly hold the external terminals, press-mounted into terminal mounting holes in the outer resin case without looseness, supporting protruding portions to prevent looseness are formed in the external terminal pressing areas, and the external terminals are pushed into the terminal mounting holes (the fourth aspect of the invention).

(4) Further, as means of preventing looseness of the external terminals similar to (3) above, a terminal clamping frame made of an insulating material and loaded into the gap between the L-shape leg portions of the external terminals mounted in the outer resin case and the metal base is provided to support the external terminals in a prescribed mounting position (the fifth aspect of the invention).

(5) Further, in the terminal support structure of (4) above, a protruding partition portion is formed in the upper face of the terminal clamping frame, corresponding to the pitch at which terminal mounting holes are arranged in the outer resin case, in order to enclose the leg portions of the external terminals from right and left to be mated and held, in order to cause the terminal clamping frame to stably clamp and support the leg portions of the external terminals mounted on the outer resin case at prescribed positions (the sixth aspect of the invention)

(6) Further, the leg portions of the external terminals and the terminal clamping frame are firmly bonded by an adhesive (the seventh aspect of the invention), and, in order to prevent absorption by the adhesive layer and attenuation of ultrasonic vibrations applied to the external terminals by a bonding tool during wire connection, bonding is performed using as an adhesive an epoxy adhesive, an acrylic adhesive, a urethane adhesive, or a silicone adhesive (the eighth aspect of the invention).

(7) Also, pressing protrusions are spread and formed on the outer face of the terminal clamping frame of (4) above, as firm pressing supports in loading into the inner periphery of the outer resin case (the ninth aspect of the invention).

Further, in a method of manufacturing a semiconductor device with the above configuration, in an outer resin case forming process, terminal mounting holes are apportioned and formed in the case peripheral wall so as to correspond to all terminal arrangements which differ according to specifications, and subsequently, in the package assembly process, terminal mounting holes corresponding to a specified terminal arrangement are selected and external terminals are press-mounted therein. Subsequently, bonding wires are connected between the leg portions of the external terminals and an insulating circuit board accommodated within the outer resin case or a semiconductor chip (the tenth aspect of the invention).

By means of the package assembly structure for a semiconductor device with the above configuration, by pressing the necessary external terminals into terminal mounting holes in the outer resin case which have been selected according to the product type and specifications in order to after-install the external terminals, the outer resin case may be employed as a common component of various models, and packages can be manufactured to flexibly accommodate various external terminal arrangements. Therefore, there is no need to design and manufacture an outer resin case with external terminals insert-molded and formed integrally according to the specifications for each type of model, as in the structure of the prior art, so that the costs required for manufacture and management of packages, including the forming mold, can be reduced. As a result, substantial reduction in product cost, as well as shortening of the time from order receipt to delivery of custom products can be achieved.

Here, by forming a depression-protrusion shape step portion according to the pitch at which terminal mounting holes are arranged in the peripheral wall upper face of the outer resin case, adequate distances along the face between the external terminals drawn upward from the resin case can be secured, and the required dielectric strength can be also secured.

Further, by forming supporting protrusions in the pressed portions of the external terminals and pressing the protrusions into the terminal mounting holes, or by supporting the external terminals in prescribed positions without looseness with the mediation of a terminal clamping frame between the leg portions of the external terminals and the metal base plate, when performing ultrasonic bonding of wire to the leg portions of the external terminals in the wiring process which follows, ultrasonic vibrations can be efficiently imparted to the joined portions of the wire from the bonding tool, and a bonding strength can be reliably secured. In addition, by using an adhesive to bond the leg portions of the external terminals to the terminal clamping frame, the terminal leg portions are fixed so as not to move from the predetermined positions, and wire bonding performance is further improved.

Further, a protrusion-shaped partition is formed in the upper face of the terminal clamping frame, and by mating and holding the leg portions of the external terminals therewith, right-left shifting of the terminal leg portions is suppressed, and the terminal leg portions can be stably supported at predetermined positions.

In addition, by forming pressing protrusions on the outer face of the terminal clamping frame and pressing these protrusions into the inside of the outer resin case, the terminal clamping frame can be firmly fixed to the outer resin case without looseness.

BRIEF DESCRIPTION OF THE DRAWINGS

FIGS. 4A, 4B, 4C show the configurations of an embodiment in which a support protrusion is formed in the pressing areas of the external terminals in FIG. 1 to prevent looseness, in which FIG. 4A through FIG. 4C are external side views of different external terminals of the aspect;

FIGS. 10A, 10B, 10C, 10D show the structures of principal portions in FIG. 9, in which FIG. 10A and FIG. 10B are enlarged views of portion 10A and portion 10B in FIG. 9 respectively, and FIG. 10C and FIG. 10D are cross-sectional views taken along the arrows 10(c)-10(c) and 10(d)-10(d) respectively in FIG. 10B;

FIGS. 13A, 13B show the structure of external terminals insert-molded in the exterior resin package of FIG. 11 and FIG. 12, in which FIGS. 13A, 13B are perspective views of external terminals with different shapes.

DETAILED DESCRIPTION OF THE PREFERRED EMBODIMENTS

Figure 1:
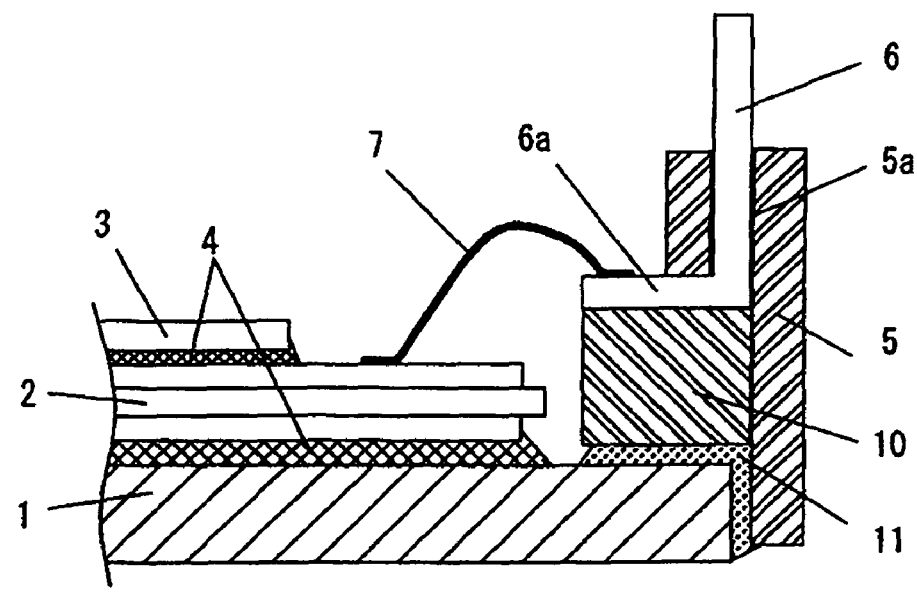
FIG. 1 is a cross-sectional view of principal portions of the package assembly structure of the first aspect of the invention.
Figure 2:
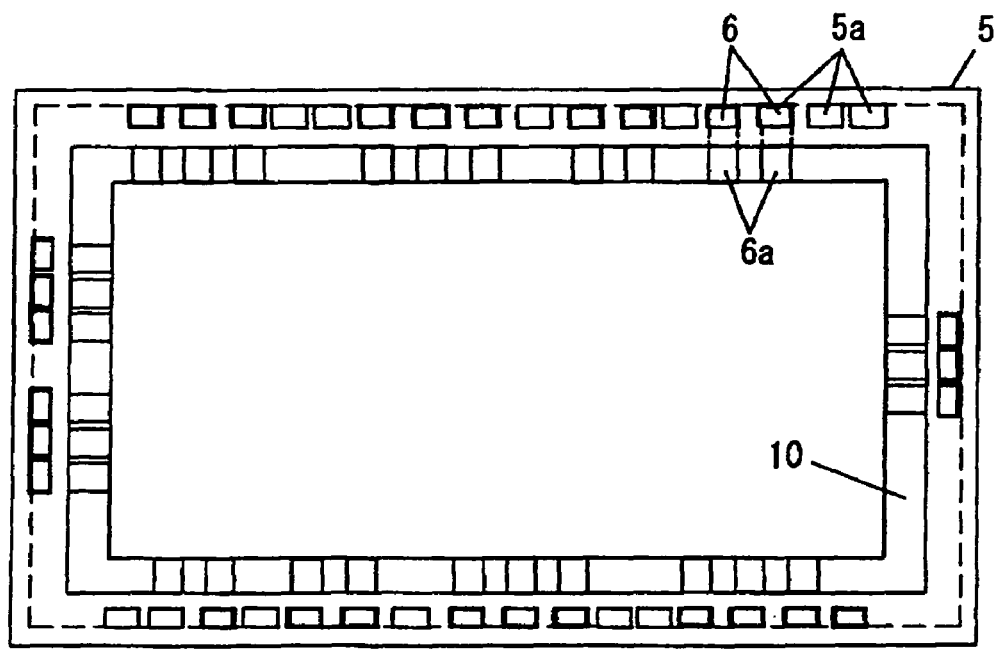
FIG. 2 is a plan view of a package, showing terminal mounting holes cast and formed in advance along the peripheral wall of the outer resin case in FIG. 1, and the arrangement of external terminals mounted in selected terminal mounting holes.
Figure 3:
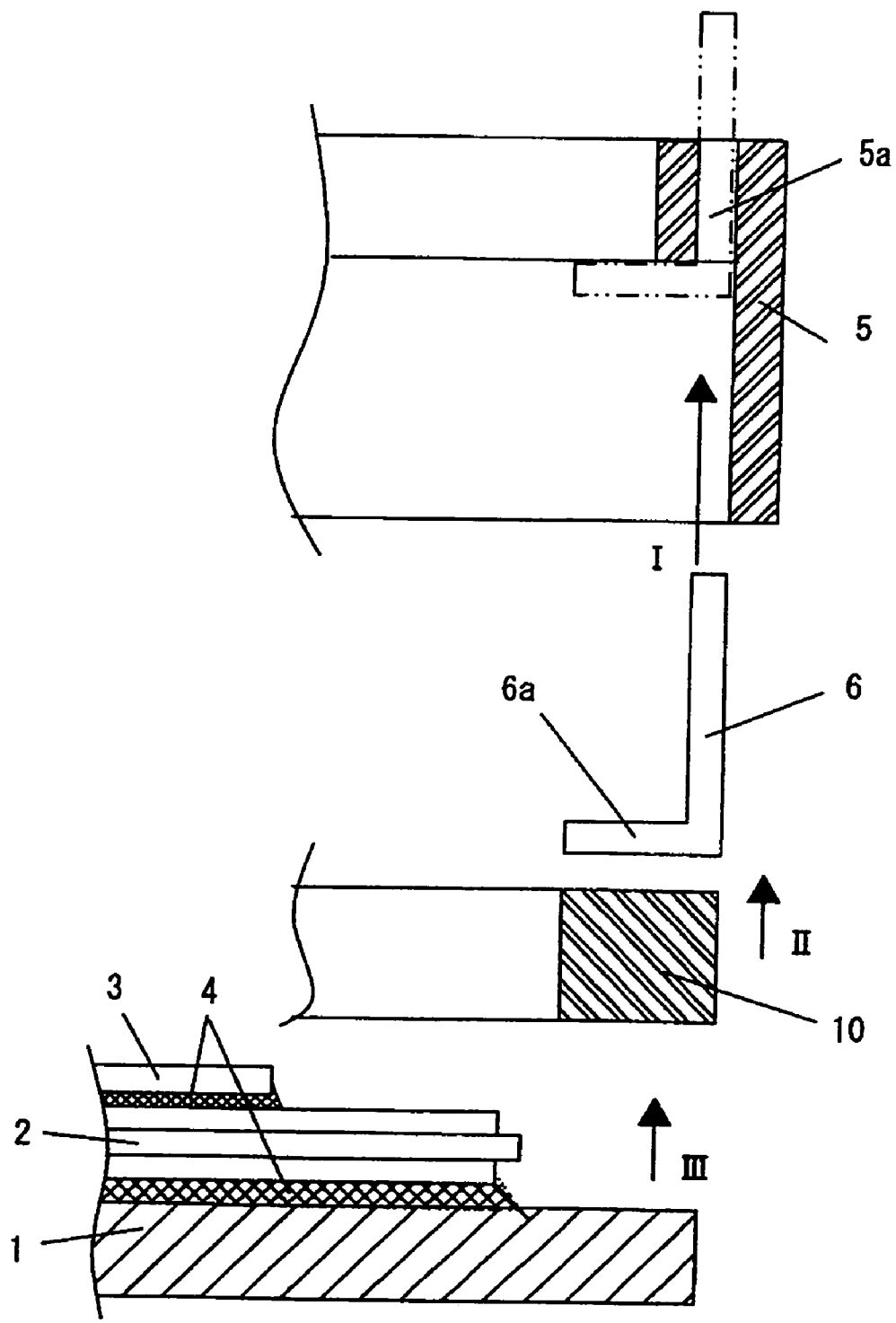
FIG. 3 is a diagram explaining a procedure for assembly of the package structure shown in FIG. 1.
Figure 4A:
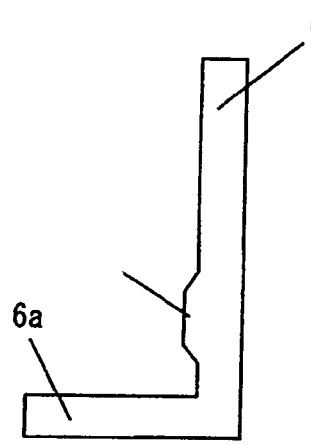
Figure 4B:
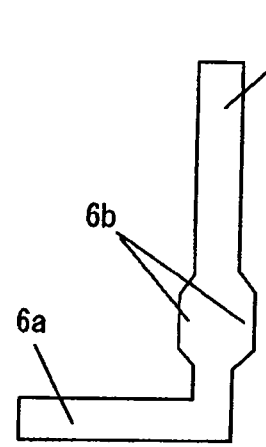
Figure 4C:
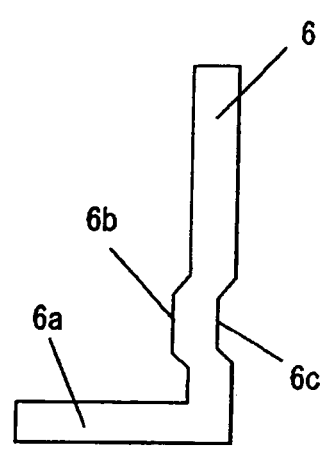
Figure 5:
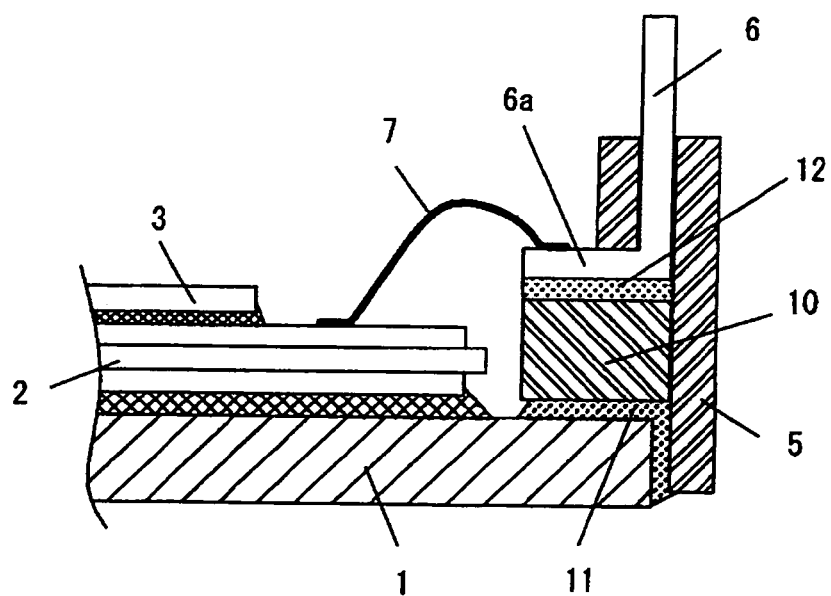
FIG. 5 is a cross-sectional view of principal portions of the package assembly structure of an applied embodiment of FIG. 1.
Figure 6:
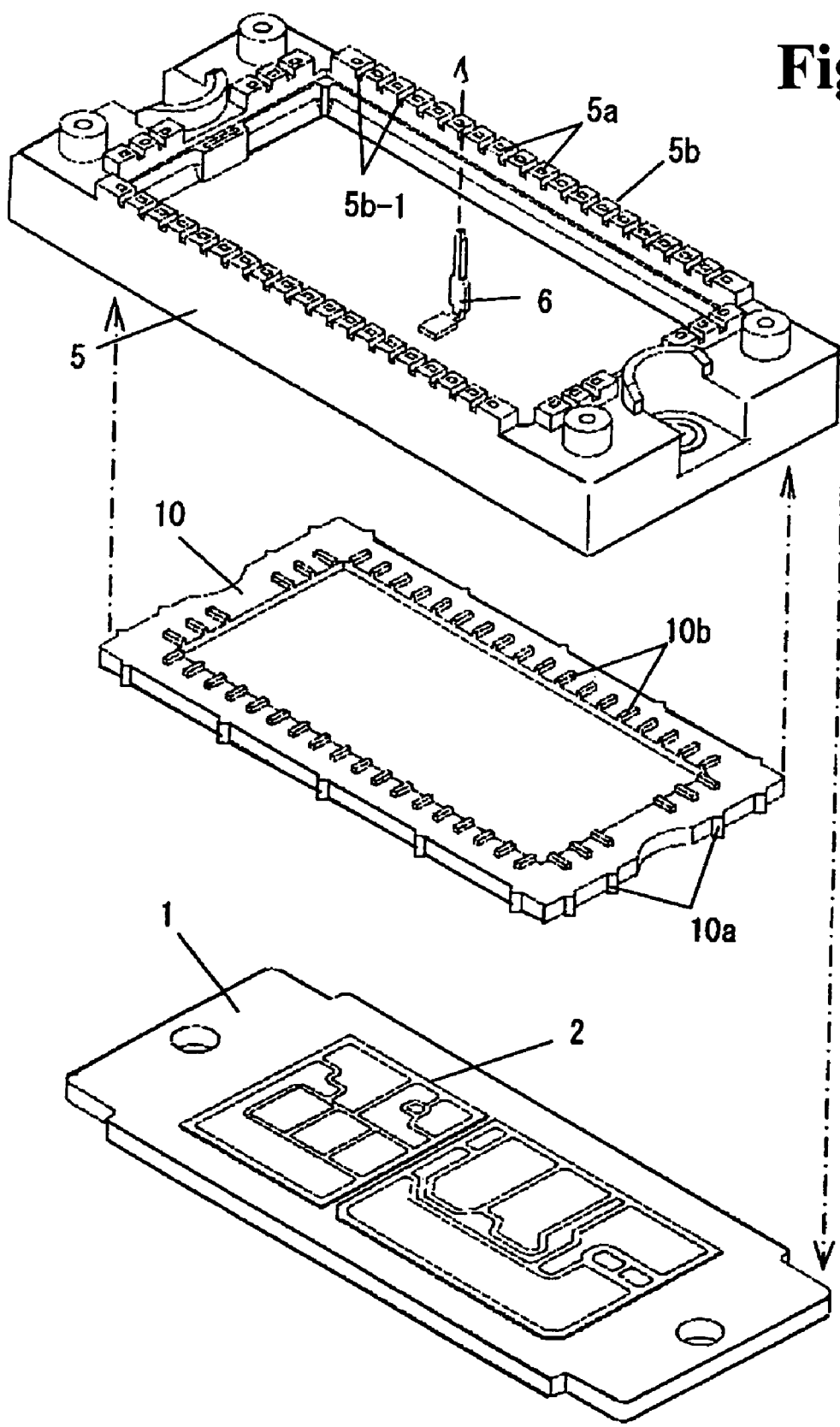
FIG. 6 is an exploded perspective view of the package structure in the second aspect of the invention.
Figure 7:
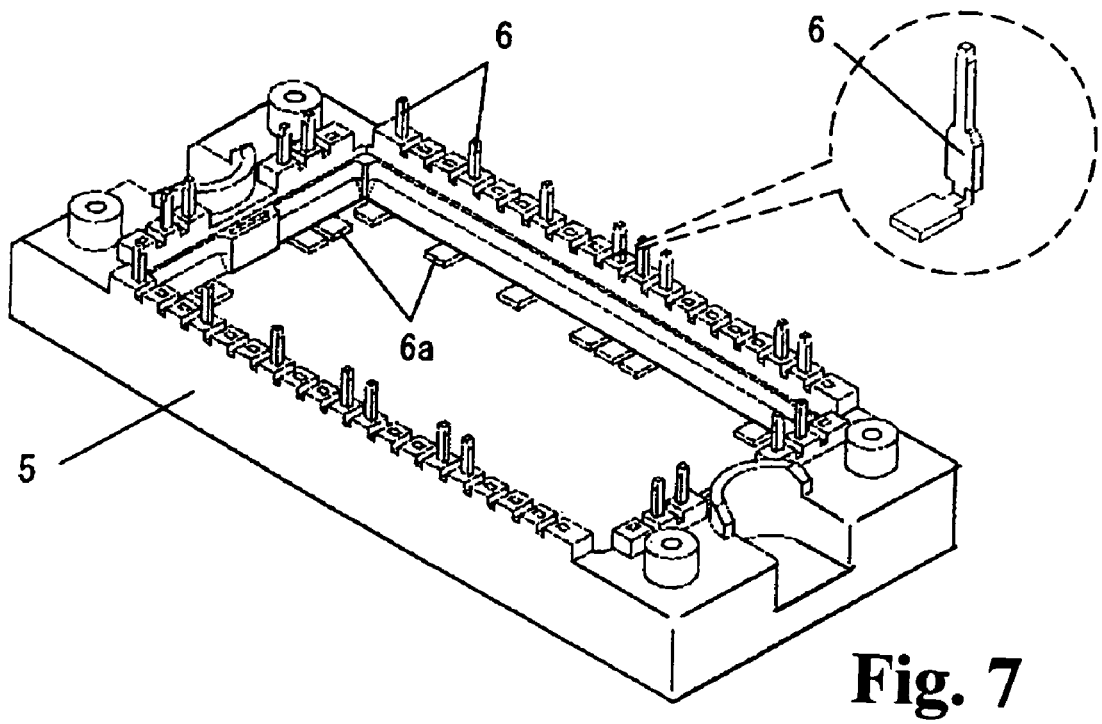
FIG. 7 is an external perspective view of the assembled state with external terminals mounted in the outer resin case of FIG. 6.
Figure 8:
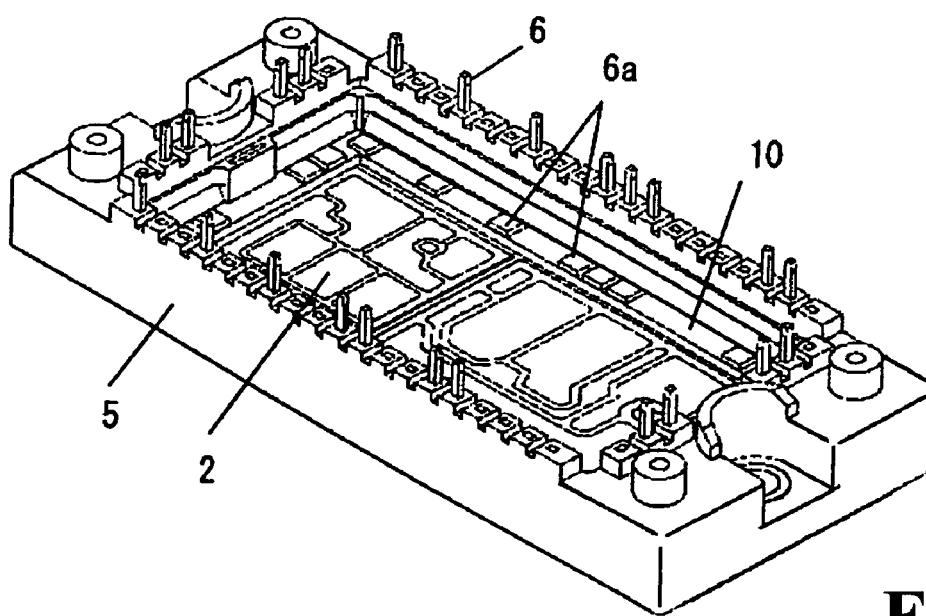
FIG. 8 is an external perspective view of the package assembled state with the board assembly in FIG. 7 mounted.
Figure 9:
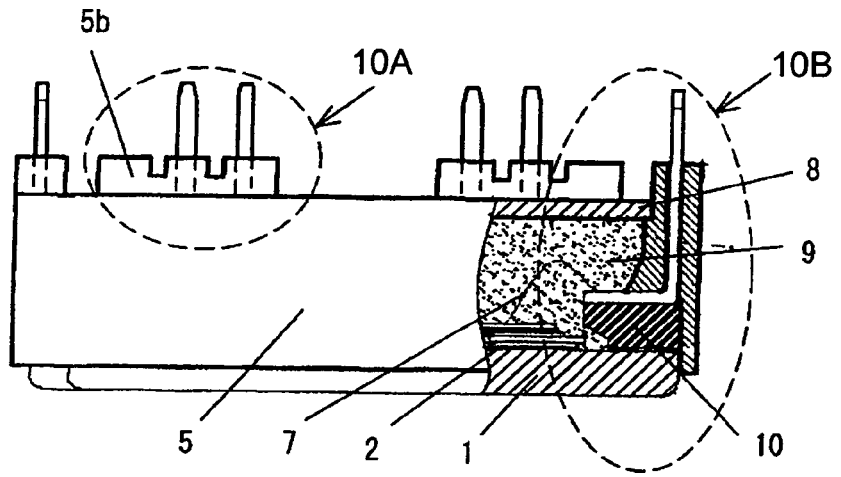
FIG. 9 is a partial cross-sectional side view of FIG. 8.

Hereinunder, the invention is explained based on embodiments shown in FIG. 1 through FIG. 10. FIG. 1 is a cross-sectional view of principal portions of a package assembly structure; FIG. 2 shows an example of terminal mounting holes formed along the peripheral wall of an outer resin case, and an arrangement of external terminals mounted in terminal mounting holes which have been selected based on the product specifications; FIG. 3 explains a procedure for package assembly; FIGS. 4A through 4C are external views of external terminals on which support protrusions are formed in pressing areas; FIG. 5 is a package assembly structure diagram of the applied embodiment of FIG. 1; FIG. 6 is an exploded perspective view of the package structure of a second embodiment of the invention; FIG. 7 and FIG. 8 are perspective views showing the assembled state of the package of FIG. 6; FIG. 9 is a cross-sectional side view of principal portions in FIG. 8; and FIGS. 10A, 10B, 10C, 10D are detailed views of principal portions in FIG. 9. Portions in the figures of the embodiments corresponding to portions in FIGS. 11 through 13B are assigned the same symbols, and detailed explanations are omitted.

Embodiment 1

First, FIG. 1 and FIG. 2 are used to explain the assembled package structure of this embodiment of the invention. This embodiment differs from a structure of the prior art, described in FIG. 11, in which external terminals 6 are insert-molded in an outer resin case 5 in an integral structure with the terminals, in the following respects. That is, in the embodiment shown, terminal mounting holes 5a are formed in advance in a plurality of locations at a fixed pitch interval along the peripheral wall of the outer resin case 5. The terminal mounting holes 5a are formed by casting with cores set in the mold corresponding to the terminal mounting holes in the process of molding the outer resin case 5. Then, at the time of package assembly, holes for mounting of external terminals 6 are selected from the terminal mounting holes 5a according to specifications specified for each device model, and external terminals 6 are pressed thereinto as described below and installed afterwards.

Here, the arranged positions of the external terminals 6 differ depending on the product model and customer-specified specifications, as explained above. Hence, the terminal mounting holes 5a formed in the peripheral wall of the outer resin case 5 are apportioned and formed in advance so as to be able to accommodate all device models and specifications.

Then, when positions for arrangement of the external terminals 6 are specified for each model of semiconductor device and terminals are mounted in the outer resin case 5, the terminal mounting holes 5a are selected according to the model and specified specifications from among numerous terminal mounting holes 5a apportioned and formed in advance in the peripheral wall of the outer resin case 5 as explained above. Then, the external terminals 6 are pressed and mounted in the selected terminal mounting holes 5a.

In the process of mounting external terminals 6, an automated assembly robot can be made to store in advance position data for the terminal mounting holes 5a apportioned in the peripheral wall of the outer resin case 5, and by setting in a program the arrangement and mounting positions for external terminals 6 specified for each device model, automated assembly can easily be performed. Further, even when the positions of arrangement of external terminals 6 for mounting are changed according to specified specifications such as in the case of custom products and so on, such processes can easily be accommodated merely by modifying the program settings of the assembly robot.

By means of the above configuration, there is no need to fabricate an outer resin case with terminals integrated by insert-molding of external terminals according to the specifications for the device model, as in the structures of the prior art, so costs incurred in design, manufacture and management of the forming mold for the resin case, and other product costs, can be greatly reduced.

On the other hand, in the assembled package structure of FIG. 1, in order to electrically insulate and isolate the L-shape leg portions 6a of the external terminals 6 protruding into the outer resin case 5 from the metal base 1 placed on the floor side of the case, and in order to clamp the terminal leg portions 6a so as to prevent movement from fixed positions, a frame-shaped terminal clamping frame 10, formed from an insulating material, is mated with the interior of the outer resin case 5, and this terminal clamping frame 10 intervenes between the lower faces of the L-shape leg portions 6a and the metal base 1.

This terminal clamping frame 10 is fabricated from a resin material similar to that of the resin case 5. After press-mounting the external terminals 6 into the outer resin case 5, the terminal clamping frame 10 is mated with the inner periphery of the outer resin case 5, and adhesive 11 (for example, silicone adhesive) is used to fix the heat-dissipating metal base 1 placed onto the lower face of the outer resin case 5 with the outer resin case 5 and the terminal clamping frame 10. In order to load the terminal clamping frame 10 into the inner periphery of the outer resin case 5 overlapping the rear-face sides of the leg portions of the external terminals 6, a depression-shaped step portion which mates with the terminal clamping frame 10 is formed, in advance, in the interior of the lower half of the outer resin case 5.

Next, a procedure for assembly of a semiconductor device with the above configuration is explained in FIG. 3. First, among the terminal mounting holes 5a formed in the peripheral wall of the outer resin case 5, external terminals 6 are pressed from the side of the bottom face of the resin case and press-mounted in selected terminal mounting holes, as indicated by the arrow I in the figure. Next, the terminal clamping frame 10 is inserted from the bottom-face side of the resin case and mated, as indicated by the arrow II in the figure, to clamp the external terminals 6 from below. Next, in a separate process, a board assembly comprising an assembled metal base 1, insulating circuit board 2, and semiconductor chip 3 is installed on the bottom-face side of the outer resin case 5 as indicated by the arrow III in the figure, and adhesive 11 is used to fix the periphery of the metal base 1 to the outer resin case 5 and terminal clamping frame 10, as explained using FIG. 1. Thereafter, an ultrasonic bonding method is used to bond bonding wire (aluminum wire) 7 to the leg portions 6a of the external terminals 6 and the conductive pattern of the insulating board 2 and span the interval therebetween. After filling the interior of the resin case 5 with sealing resin 9 (see FIG. 11), the case lid 8 is installed, to complete the product.

When using ultrasonic bonding to bond the leg portions 6a of the external terminals 6 to the wire 7 in the assembly process, if there is looseness in the external terminals 6 which have been pressed into and installed later in the terminal mounting holes 5a of the outer resin case 5, then ultrasonic vibrations imparted to the surfaces of the external terminals 6 from the bonding tool are not efficiently transmitted, and the bonding strength of the wire 7 may be undermined. Hence, in this invention, the external terminals 6 are firmly fixed to predetermined mounting locations and supported by means described below. This aspect is explained in FIG. 4 and FIG. 5.

First, in the embodiment of FIGS. 4A through 4C, support protrusions 6b to prevent looseness are formed at the pressing areas (the portions inserted into the terminal mounting holes 5a formed in the outer resin case 5) of the external terminals 6. Here, in the structure shown in FIG. 4A, a trapezoidal support protrusion 6b is formed on one side of the pressing area face of an external terminal 6 and bulged by a press molding method. This support protrusion 6b is provided to compensate for dimensional tolerance and to enable a close fit between the terminal mounting hole 5a formed by casting in the outer resin face 5 (see FIG. 3) and the external terminal 6, and provides interference at the protrusion 6b. The support protrusions 6b may be formed on both sides of the external terminals 6, as shown in FIG. 4B. As stated above, press work to form protrusions such as described above in the external terminals 6 requires a greater number of processes and higher costs, so that so as indicated in FIG. 4C, the protrusion can also be formed by hitting from the surface on the side opposite the protrusions 6b. Also, 6c represents a depression formed in the face on the side opposite the protrusion 6b due to the hitting.

The support protrusions 6b should be formed on a face not opposing an adjacent external terminal in the state in which the external terminals 6 are pressed into terminal mounting holes 5a of the outer resin case 5. This is because, if the protrusions 6b are formed on a side opposing an adjacent external terminal, when the external terminals 6 are pressed in place, the terminal mounting holes 5a, being pressed by the support protrusions 6b, are pressed and widened in the direction of the adjacent external terminal, and consequently the resin case itself is distorted so that deformation may occur.

On the other hand, in the assembled package structure shown in FIG. 5, as means of preventing looseness of the leg portions 6a of the external terminals 6 press-mounted in the outer resin case 5, adhesive 12 is used for adhesive bonding of the terminal clamping frame 10 (see FIG. 1) with the lower-face side of the leg portions 6b intervening, so that the leg portions 6a of the external terminals 6 are firmly fixed in the fixed positions.

As the adhesive 12, an epoxy adhesive, acrylic adhesive, urethane adhesive, or silicone adhesive can be employed.

Embodiment 2

Next, a second embodiment, in which the package structure is further improved on the above Embodiment 1, is explained referring to FIG. 6 through FIG. 10D. In this embodiment, the following structural modifications of the outer resin case 5 and terminal clamping frame 10 are made. That is, depression-protrusion shape step portions 5b are formed along the peripheral wall of the outer resin case 5 on the upper-face side. These depression-protrusion shape step portions 5b are formed at the same pitch as the terminal mounting holes 5a, such that the depression grooves 5b-1 are positioned midway between adjacent terminal mounting holes 5a. By this means, as shown in FIG. 10A, a creepage distance d is formed which is greater than the spatial distance between the external terminals 6 drawn outward from the outer resin case 5, so that a high dielectric strength can be secured.

Figure 10A:
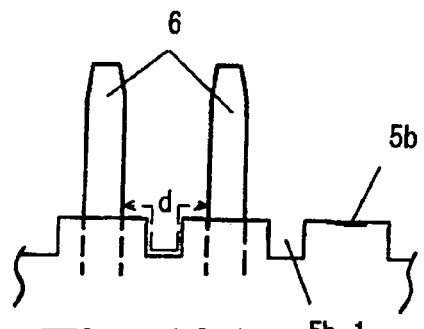
Figure 10B:
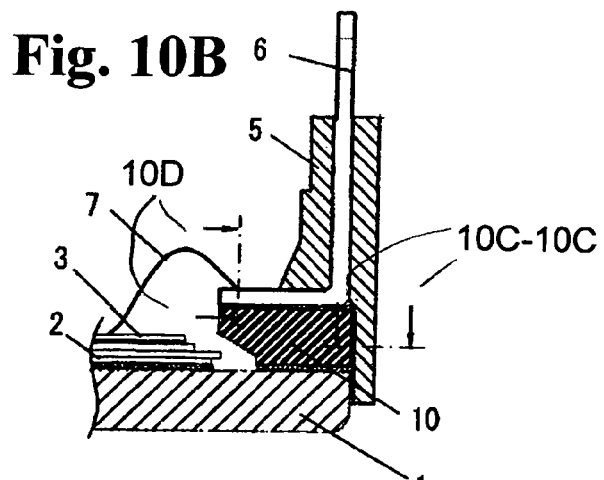
Figure 10C:
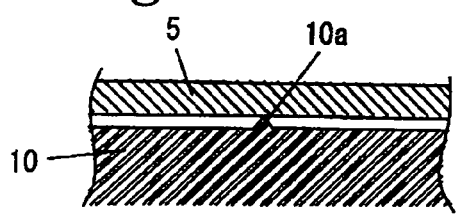

On the other hand, pressing protrusions 10a with a cross-sectional V-shape are distributed and formed along the peripheral face of the terminal clamping frame 10. When the terminal clamping frame 10 is inserted into and mated with the outer resin case 5, these pressing protrusions 10a penetrate into the inner wall of the outer resin case 5 as shown in FIG. 10C, and support the terminal clamping frame 10 such that there is no looseness.

Figure 10D:
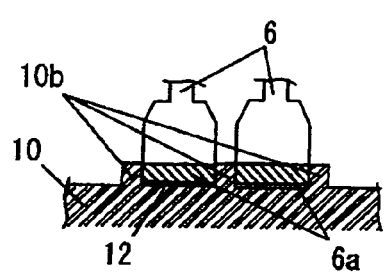
Figure 11:
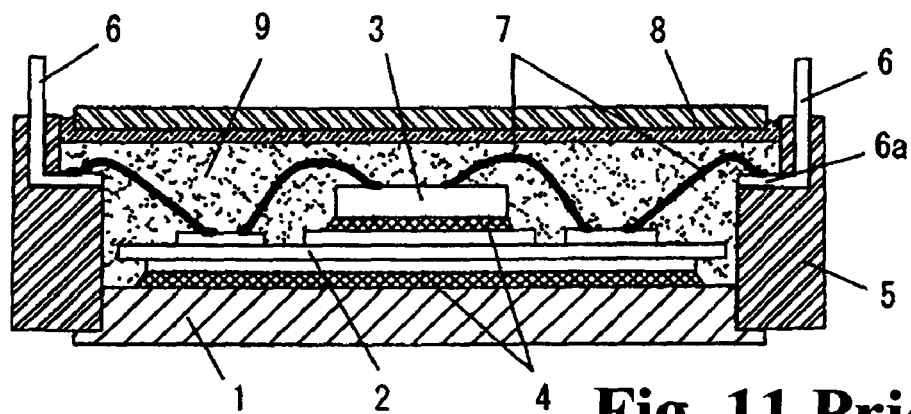
FIG. 11 shows the package assembly structure of a semiconductor device of the prior art.
Figure 12:
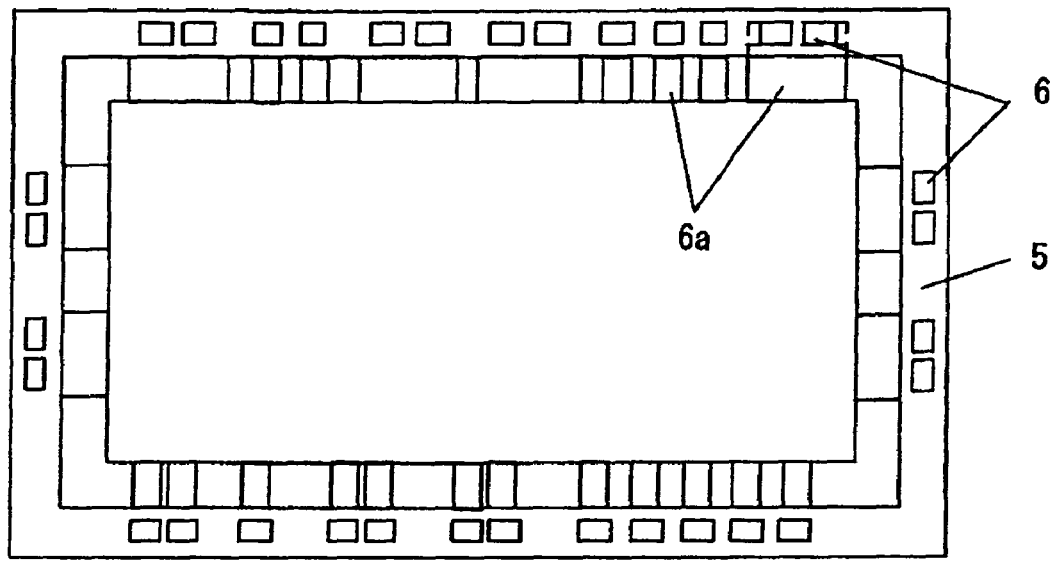
FIG. 12 is a plan view of an exterior resin case, integrated with external terminals, corresponding to FIG. 11.
Figure 13A:
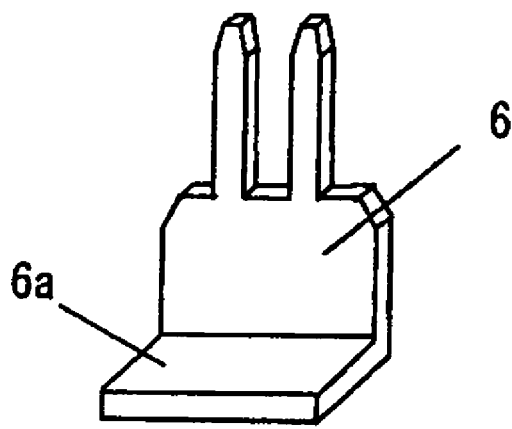
Figure 13B:
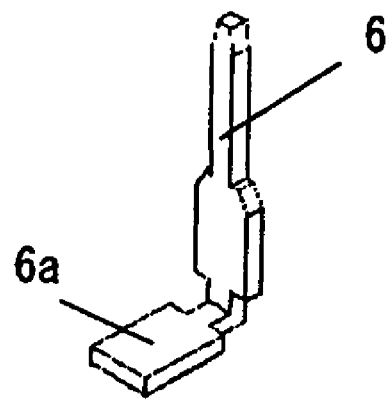

Further, on the upper-face side of the terminal clamping frame 10, numerous protruding partition portions 10b are formed to be distributes along the inner periphery thereof. As shown in FIG. 10D, these protruding partition portions 10b are provided in order to clamp from left and right and hold the L-shape leg portions 6a of the external terminals 6, press-mounted into the outer resin case, such that there is no motion to left or right from the fixed position. Similarly to the above-described depression-protrusion shape step portions 5b, the protruding partition portions 10b are formed to be distributed at the pitch of the terminal mounting holes 5a of the outer resin case 5.

By means of the above configuration, the L-shape leg portions 6a of the external terminals 6 can be fixed and supported, without looseness, at fixed positions in the assembled state of a package. By this means, attenuation of the ultrasonic vibrations imparted from a bonding tool to the leg portions 6a of the external terminals 6 during a subsequent process of ultrasonic bonding of wires 7 can be effectively suppressed, to secure high wire bonding strength, and product reliability can be enhanced.

The disclosure of Japanese Patent Applications No. 2007-058030, filed on Mar. 8, 2007, and No. 2007-150426, filed on Jun. 6, 2007 are incorporated in the application.

While the invention has been explained with reference to the specific embodiments of the invention, the explanation is illustrative and the invention is limited only by the appended claims

What is claimed is:

1. A semiconductor device, comprising:
an outer resin case having a peripheral wall and multiple terminal mounting holes formed in the peripheral wall,
a layer assembly provided in the outer resin case and including a semiconductor chip, an insulating circuit board on which the semiconductor chip is mounted, and a heat-dissipating metal base on which the insulating circuit board is mounted,
external terminals arranged in the peripheral wall of the outer resin case and having terminal leg portions extending to inside the case,
a terminal clamping frame disposed between the heat-dissipating metal base and the terminal leg portions, and
bonding wires for connecting the terminal leg portions and a conductive pattern of the insulating circuit board or the semiconductor chip,
wherein said multiple terminal mounting holes in the outer resin case are arranged side by side so as to conform to different terminal arrangements according to device models and specifications, and the external terminals are press-fitted into only selected ones of the multiple terminal mounting holes for the particular semiconductor device to leave unfilled terminal mounting holes.

2. The semiconductor device according to claim 1, wherein the outer resin case includes depression-protrusion shape step portions formed in an upper face of the peripheral wall of the outer resin case, said depression-protrusion shape step portions corresponding to a pitch at which the terminal mounting holes are arranged.

3. The semiconductor device according to claim 1, wherein said external terminal includes a supporting protruding portion to prevent looseness, said supporting protruding portion being formed in a press fitting portion of the external terminal.

4. The semiconductor device according to claim 1, wherein the terminal clamping frame is made of an insulating material and loaded into a gap between the terminal leg portion and the metal base so as to support the external terminals in predetermined mounting positions.

5. The semiconductor device according to claim 4, wherein the terminal clamping frame comprises protruding partition portions formed in an upper face of the terminal clamping frame, said protruding partition portions corresponding to a pitch at which the terminal mounting holes are arranged in the outer resin case and sandwiching the terminal leg portions to be mated and held.

6. The semiconductor device according to claim 4, wherein the terminal leg portions and the terminal clamping frame are bonded by an adhesive.

7. The semiconductor device according to claim 6, wherein the adhesive is selected from a group consisting of an epoxy adhesive, an acrylic adhesive, a urethane adhesive, and a silicone adhesive.

8. The semiconductor device according to claim 4, wherein the terminal clamping frame includes pressing protrusions distributed and formed on an outer face of the terminal clamping frame to be press-fitted and supported in an inner periphery of the outer resin case.

9. The semiconductor device according to claim 1, wherein the terminal clamping frame is adhesively bonded to the heat-dissipating metal base and to an surface of the outer resin case.

10. The semiconductor device according to claim 1, wherein the insulating circuit board is soldered to the heat-dissipating metal base.

* * * * *